United States Patent [19]

Zenshi

[11] Patent Number: 5,180,097
[45] Date of Patent: Jan. 19, 1993

[54] METHOD OF MOUNTING AN ELECTRONIC PART ONTO A PRINTED CIRCUIT BOARD

[75] Inventor: Yoshio Zenshi, Amagasaki, Japan

[73] Assignee: Mitsubishi Denki Kabushiki Kaisha, Hyogo, Japan

[21] Appl. No.: 585,700

[22] Filed: Sep. 20, 1990

[30] Foreign Application Priority Data

Oct. 3, 1989 [JP] Japan ................... 1-259284

[51] Int. Cl.⁵ ............................................. H05K 3/34
[52] U.S. Cl. ............................ 228/180.2; 228/248; 228/258
[58] Field of Search ........... 228/248, 247, 245, 180.2, 228/41, 246, 258, 122, 124

[56] References Cited

U.S. PATENT DOCUMENTS

| | | | |
|---|---|---|---|
| 3,786,556 | 1/1974 | Weston | 228/258 |
| 4,381,590 | 5/1983 | Nonnenmann et al. | 228/245 |
| 4,412,643 | 11/1983 | Sato et al. | 228/245 |
| 4,428,523 | 1/1984 | Snitzer et al. | 228/124 |
| 4,607,782 | 8/1986 | Mims | 228/248 |
| 4,821,946 | 4/1989 | Abe et al. | 228/248 |

FOREIGN PATENT DOCUMENTS

| | | | |
|---|---|---|---|
| 55-103276 | 8/1980 | Japan | 228/247 |
| 60-58600 | 12/1985 | Japan . | |
| 61-129281 | 6/1986 | Japan | 228/248 |

OTHER PUBLICATIONS

Office Action of French Application No. 9012064; and two articles cited therein.

Primary Examiner—Samuel M. Heinrich
Attorney, Agent, or Firm—Birch, Stewart, Kolasch & Birch

[57] ABSTRACT

In a method of mounting an electronic component onto a printed circuit board by reflow mounting, the electronic component having a plurality of connection leads protruding from the component, a plurality of strips of solder are applied on a group of pads arranged in a line on the printed circuit board. The pads are disposed on the circuit in correspondence to the connection leads, and the connection leads of the electronic component are bonded to the corresponding pads by reflow soldering. By applying solder in strips, their widths need not be excessive, thereby avoiding solder bridging.

15 Claims, 2 Drawing Sheets

METHOD OF MOUNTING AN ELECTRONIC PART ONTO A PRINTED CIRCUIT BOARD

BACKGROUND OF THE INVENTION

1. Field of the Invention

The invention relates to a method of mounting, to a printed circuit board, an electronic component having connection leads or pins that extend from the electronic component.

2. Description of the Background Art

FIGS. 4A and 4B illustrate a conventional method of mounting an electronic component, for example, a flat-package IC, as disclosed in Japanese Patent KoKoKu Publication No. 60-58600. FIG. 4A is a plan view showing solder paste as it has been applied to a printed circuit board. FIG. 4B is an enlarged perspective view of section A, which is encircled by a broken line in FIG. 4A.

In the figures, reference numeral 11 denotes a printed circuit board; 14a and 14b denote pads arranged on the printed circuit board 11 to form four rows 24 parallel to the four sides of an electronic component such as a flat-package IC device, which is to be mounted and which is not shown. Pads 14b which are positioned at the ends of the rows 24 are wider than pads 14a. The pads 14a and the wide pads 14b are arranged at an equal interval or pitch so as to allow contact with connection leads projecting at an equal interval from each side of the electronic component. Element 15 is a strip of solder paste applied linearly, uniformly, and in the direction of each pad row 24.

An electronic component such as a flat-package IC device is mounted on the printed circuit board 11 in the following manner. First, solder paste 15 is applied in a strip across each pad row 24. Here, the solder paste is applied linearly, uniformly, and, so that a suitable amount may be applied, with its width adjusted in accordance with the dimensions of pads 14a, the dimensions of wide pads 14b, and the dimensions of connection leads protruding from the IC device to be mounted. Next, the IC device connection leads are bonded to the corresponding pads (pad 14a or wide pad 14b) by reflow soldering.

In reflow soldering, the previously applied solder paste 15 agglomerates (draws in together) on each pad upon melting and through an action of surface tension; by this, solder near one pad draws away from solder near adjacent pads. Afterwards, the solder solidifies, thereby binding or fixing the IC device to the printed circuit board 11.

However, this conventional method of mounting an electronic component has the following problems the amount of solder paste to be the amount of solder paste to be applied is determined in accordance with the dimensions of the pads and the dimensions of the connection leads of the component and is adjusted by adjusting the width of the strip of solder paste applied in advance. Consequently, if the width of the strip is made too large (i.e., if the amount of solder paste applied is excessive), an excess of solder paste may occur in components; and upon reflow soldering, the solder may not agglomerate sufficiently on top of a pad, thereby causing "solder bridging" and necessitating corrective work after soldering. On the other hand, if, in order to prevent the occurrence of solder bridging, the width of the solder is made too small, there may occur an insufficiency of solder.

Furthermore, there is often a need to position, between adjacent ends of pad rows orthogonal to each other, other circuit patterns; however, should the last pad in each pad row be a wide pad, it is often difficult to obtain space sufficient to dispose such other circuit pattern.

SUMMARY OF THE INVENTION

The invention seeks to solve the above problems and has as its purpose the attainment of a method for mounting an electronic component on a printed circuit board in such a way that an amount of solder suitable for the dimensions of the pads and the dimensions of the connection leads of the electronic component can be applied; unsuccessful soldering (insufficient solder, solder bridging, etc.) can be prevented; and placement of other circuit patterns is not obstructed.

The method of this invention is for mounting by reflow soldering, onto a printed circuit board, an electronic component having a plurality of connection leads protruding from that component, and includes the steps of:

applying a plurality of strips of solder on a group of pads arranged in a line on the printed circuit board, disposed in correspondence to said connection leads; and bonding the connection leads of the electronic component to the corresponding pads by reflow soldering.

By the invention, the amount of solder applied can be optimized for the dimensions of the pads and the dimensions of the connection leads by adjusting the number of stripes of solder. As a result, solder bridging can be avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION OF THE PREFERRED EMBODIMENTS

An embodiment of the invention will now be described below with reference to the drawings.

Figure 1:
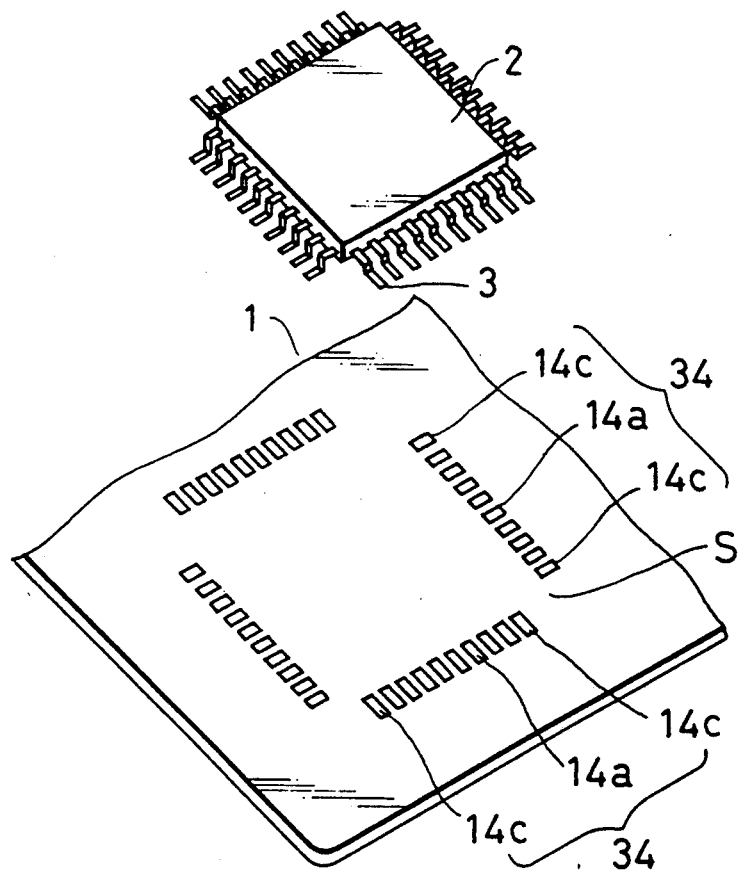
FIG. 1 is a perspective view showing a flat-package IC mounted on a printed circuit board in an embodiment of the invention.
Figure 2:
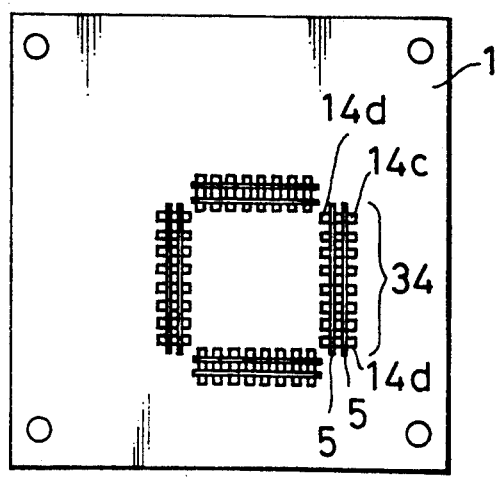
FIG. 2 is a plan view showing solder paste as it has been applied to the printed circuit board of FIG. 1.

FIG. 1 is a perspective view showing a typical flat-package IC device mounted on a printed circuit board in an embodiment of the invention. FIG. 2 is a plan view showing solder paste as it has been applied to a printed circuit board in the embodiment of FIG. 1.

In FIG. 1, reference numeral 1 denotes a printed circuit board, 2 denotes an IC device, and 3 denotes connection leads or pins projecting from four sides of IC device 2 at an equal interval. Elements 14a and 14c are pads of the same shape which are provided on printed circuit board 1; these pads are arranged in four rows 34 on printed circuit board 1 which are parallel to the sides of the IC device 2 to be mounted on the printed circuit board 1. The pads 14a and 14c have an interval and arrangement corresponding to those of connection leads 3. The pads 14a and 14c are elongated in a direction at right angles to the direction of each pad row 34. In FIG. 2, continuous strips (in this example, two strips) of solder paste 5 are applied linearly, uniformly, and in the direction of each pad row 34.

Described below is a method of mounting an electronic component on a printed circuit board according to an embodiment of the invention.

First, solder paste 5 is applied linearly and uniformly in two strips across pad row 34 and in the direction of pad row 34. The number of strips of solder paste 5 to be applied as well as the width of each solder paste strips is determined in accordance with the dimensions of pads 14a, the dimensions the connection leads 3 of IC device 2, and the like, so that a proper amount of solder paste 5 is applied. Furthermore, strips of solder paste 5 are applied up to a certain distance projecting past outer ends 14d of pads 14c, situated on both ends of pad row 34. This distance or projection is equal to half of the spacing between adjacent pads. Next, connection leads 3 are placed in contact with the respective pads 14a and 14c, and reflow soldering, in which the solder is heated to be melted, is performed. By this, connection leads 3 are bonded to pads 14a and 14c; and IC device 2 is secured in place.

In the method of mounting described above, two strips of solder paste 5 melt during reflow soldering; the molten solder then agglomerates (draws in together) on pads 14a and 14c through an action of surface tension. By adjusting the number of strips of solder paste 5, one can apply an amount of solder paste 5 appropriate for the dimensions of the pads 14a and 14c and the dimensions of connection leads 3 of IC device 2.

Furthermore, by providing a plurality of strips of solder paste 5 as in the above embodiment, one can adjust, in accordance with the dimensions of pads 14a and connection leads 3, the width of the strips of solder paste 5 to a range within which no excess of solder paste 5 occurs upon reflow soldering; thereby, solder will agglomerate sufficiently on the pads 14a and 14c, and solder bridges will not occur. On the other hand, an insufficiency of solder can be prevented by adjusting the number of strips of solder 5 as required to assure a suitable amount.

Furthermore, as for pads 14c on both ends of each pad row 34, by applying strips of solder paste 5 out past each outer end 14d of pad 14c over a distance equal to half of the spacing between adjacent pads, one can assure a suitable amount of solder paste 5 during reflow soldering; specifically, one can assure that, upon melting, solder paste 5, equal in amount to solder paste which agglomerates on pads 14a, agglomerates on pad 14c through an action of surface tension. In addition, there is no need to utilize a wide pad like that of the prior art; thereby, a relatively large gap S can be obtained in an area on printed circuit board 1 between adjacent ends of pad rows 34 orthogonal to each other; consequently, a relatively large space is provided in which to position another circuit pattern (not shown).

Described below is another embodiment of the invention.

Figure 3:
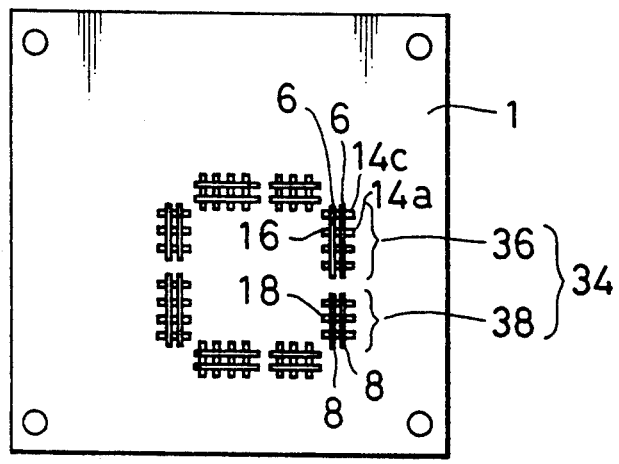
FIG. 3 is a plan view showing another embodiment of the invention.
Figure 4A:
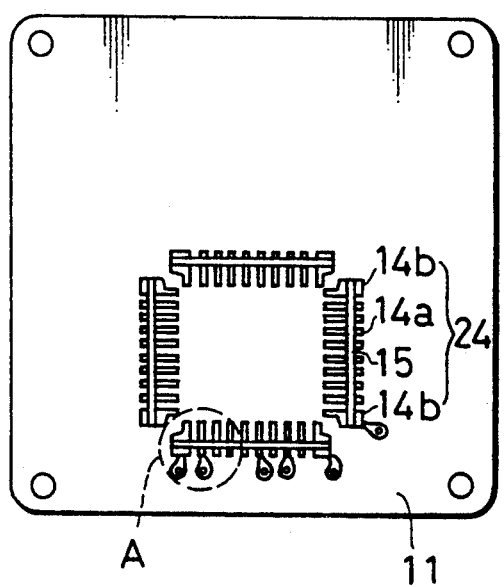
FIG. 4A is a plan view showing solder paste as it has been applied to a conventional printed circuit board.
Figure 4B:
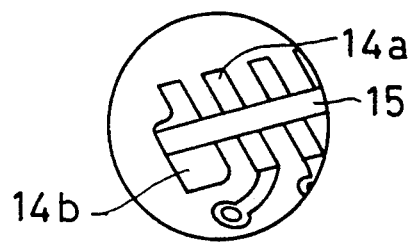
FIG. 4B is an enlarged perspective view of section A, which is encircled by a broken line in FIG. 4A.

FIG. 3 is a plan view of another embodiment of the invention. Structural elements identical to those of FIG. 1 are indicated with the same numeral. FIG. 3 shows solder paste as it has been applied to mount an IC device that has connection leads projecting from its sides at an incongruous spacing. In this embodiment, each pad row 34 parallel with each of the sides of the IC device 2 to be mounted comprises two groups of pads 36 and 38. The pad group 36 is made of up pads 16 arranged in a line at an equal interval. The pad group 38 is similarly made up of pads 18 in a line at an equal intervals. The interval at between pads 16 are different than the intervals between pads 18. A pair of strips 6 of solder paste are applied to the pad group 36. Another pair of strips 8 of solder paste are applied to the pad group 38. In other words, each pair of strips 6 or 8 of solder paste are applied over pad group 36 or 38 composed only of equally spaced pads 14a and does not extend to the other pad group 38 or 36. On both ends of each pad group 36 or 38, strips 6 or 8 of solder paste are applied out past each outer end of the pad at the end of each pad group, over a distance equal to half of the spacing between adjacent pads in the same pad group. It does not matter if the strips of solder paste of each pad group are in contact with the strips of solder paste of the other pad group, since the solder paste will agglomerate during reflow soldering. In other respects, this embodiment is the same as that described in reference to FIGS. 1 and 2.

In the embodiments described above, solder paste was as illustrative; however, the invention is not limited to the use of solder paste, formed solder and the like may also be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of mounting an electronic component, by reflow soldering, onto a printed circuit board, the electronic component having a plurality of connection leads protruding therefrom, the method comprising the steps of:

applying a plurality of strips of solder on a group of pads arranged in a line on the printed circuit board, the group of pads being disposed in a one to one correspondence with the connection leads, each of the plurality of strips of solder traversing the group of pads; and bonding the connection leads of the electronic component to corresponding pads of the group of pads, by reflow soldering, to the plurality of strips of solder.

2. The method of mounting an electronic component of claim 1, wherein the corresponding pads of the group of pads over which the plurality of strips of solder are applied are arranged with equal intervals therebetween, corresponding to the intervals between the connection leads of the electronic component.

3. The method of mounting an electronic component of claim 2, wherein the plurality of strips of solder are applied linearly and uniformly in a longitudinal direction of the group of pads.

4. The method of mounting an electronic component of claim 3, wherein the plurality of strips of solder project out past an end of the group of pads by a length equal to one-half of a distance between adjacent pads on that group of pads.

5. The method of mounting an electronic component of claim 1, wherein the plurality of solder strips are solder paste.

6. The method of mounting an electronic component of claim 1, wherein the plurality of solder strips are the same width.

7. The method of mounting an electronic component of claim 1, wherein the corresponding pads of the group of pads are of a shape elongated in a direction at right angles to the line in which the group of pads are arranged.

8. The method of mounting an electronic component of claim 1, wherein each of the connection leads are mounted to corresponding pads of the group of pads by at least two of the plurality of solder strips.

9. A method of mounting an electronic component, by reflow soldering, onto a printed circuit board, the electronic component having a plurality of connection leads protruding therefrom, the method comprising the steps of:
  applying a plurality of strips of solder on a group of pads arranged in a line on the printed circuit board, the group of pads being disposed in a one to one correspondence with the connection leads and comprising subgroups of pads, each of the subgroups of pads being traversed by at least two of the plurality of strips of solder; and
  bonding the connection leads of the electronic component to corresponding pads of the group of pads, by reflow soldering, to the plurality of strips of solder,
  said step of applying a plurality of strips of solder preventing solder bridging due to insufficient agglomeration of solder on the pads.

10. The method of mounting an electronic component of claim 9, wherein the corresponding pads of the group of pads over which the plurality of strips of solder are applied are arranged with equal intervals therebetween, corresponding to the intervals between the connection leads of the electronic component.

11. The method of mounting an electronic component of claim 10, wherein the plurality of strips of solder are applied linearly and uniformly in a longitudinal direction of the group of pads.

12. The method of mounting an electronic component of claim 9, wherein the plurality of strips of solder project out past ends of the subgroup of pads by a length equal to one-half a distance between adjacent pads of the subgroup of pads.

13. The method of mounting an electronic component of claim 9, wherein each of the connection leads are mounted to corresponding pads of the group of pads by at least two of the plurality of solder strips.

14. A method of mounting an electronic component, by reflow soldering, onto a printed circuit board, the electronic component having four sides and a plurality of connection leads protruding from each of the for sides, the method comprising the steps of:
  applying a plurality of strips of solder on groups of pads arranged in lines on the printed circuit board, pads of the groups of pads being disposed in a one to one correspondence with the connection leads, each of the groups of pads being traversed by at least two of the plurality of strips of solder; and
  bonding the connection leads of the electronic component to corresponding pads of the groups of pads, by reflow soldering, to the plurality of strips of solder,
  said step of applying a plurality of strips of solder preventing solder bridging due to insufficient agglomeration of solder on the pads.

15. The method of mounting an electronic component of claim 14, wherein each of the connection leads are mounted to corresponding pads of the group of pads by at least two of the plurality of solder strips.

* * * * *